US007969338B2

(12) United States Patent
Lee

(10) Patent No.: US 7,969,338 B2
(45) Date of Patent: Jun. 28, 2011

(54) DECODING CIRCUIT FOR FLAT PANEL DISPLAY

(75) Inventor: Yong-Jae Lee, Yongin-si (KR)

(73) Assignee: AnaPass Inc., Seoul (KR)

( * ) Notice: Subject to any disclaimer, the term of this patent is extended or adjusted under 35 U.S.C. 154(b) by 451 days.

(21) Appl. No.: 12/094,526

(22) PCT Filed: Feb. 10, 2006

(86) PCT No.: PCT/KR2006/000485

§ 371 (c)(1),
(2), (4) Date: May 21, 2008

(87) PCT Pub. No.: WO2007/058408

PCT Pub. Date: May 24, 2007

(65) Prior Publication Data

US 2008/0298462 A1 Dec. 4, 2008

(30) Foreign Application Priority Data

Nov. 21, 2005 (KR) ........................ 10-2005-0111093

(51) Int. Cl.
*H03M 1/66* (2006.01)

(52) U.S. Cl. ........................................ 341/136; 341/144

(58) Field of Classification Search .................. 341/136, 341/144, 154
See application file for complete search history.

(56) References Cited

U.S. PATENT DOCUMENTS 5,999,115 A * 12/1999 Connell et al. ................ 341/145
6,075,477 A * 6/2000 Kokubun et al. .............. 341/154
6,232,941 B1 * 5/2001 Ode et al. ........................ 345/95
6,608,612 B2 8/2003 Kokubun et al.
7,126,518 B2 * 10/2006 Tsuchi .......................... 341/144
7,265,697 B2 * 9/2007 Tsai et al. ..................... 341/144

FOREIGN PATENT DOCUMENTS

JP 2000-156639 A 6/2000
JP 2001-036407 2/2001
JP 2003-029687 A 1/2003
JP 2005-017933 1/2005

OTHER PUBLICATIONS

Machine Translation of JP 2001-036407 from http://ipdl.inpit.go.jp on Oct. 20, 2010.*

* cited by examiner

*Primary Examiner* — Howard Williams
(74) *Attorney, Agent, or Firm* — Sherr & Vaughn, PLLC

(57) ABSTRACT

The present invention relates to a decoding circuit for a flat panel display, and more particularly to a decoding circuit for a flat panel display wherein a miniaturization is possible by reducing an area of the circuit. There is provided a decoding circuit comprising: a first decoder for selecting a predetermined number of gradation voltages from a plurality of gradation voltages according to a least significant bit or least significant bits of an image data; a second decoder for selecting one of the selected gradation voltages to be outputted to an output terminal according to a plurality of selection signals; and a third decoder for outputting the plurality of the selection signals according to a most significant bit or most significant bits of the image data, wherein a minimum length of gates of a plurality of MOSFETs included in the first decoder is shorter than that of a plurality of MOSFETS included in the second decoder.

32 Claims, 7 Drawing Sheets

[Fig. 1]
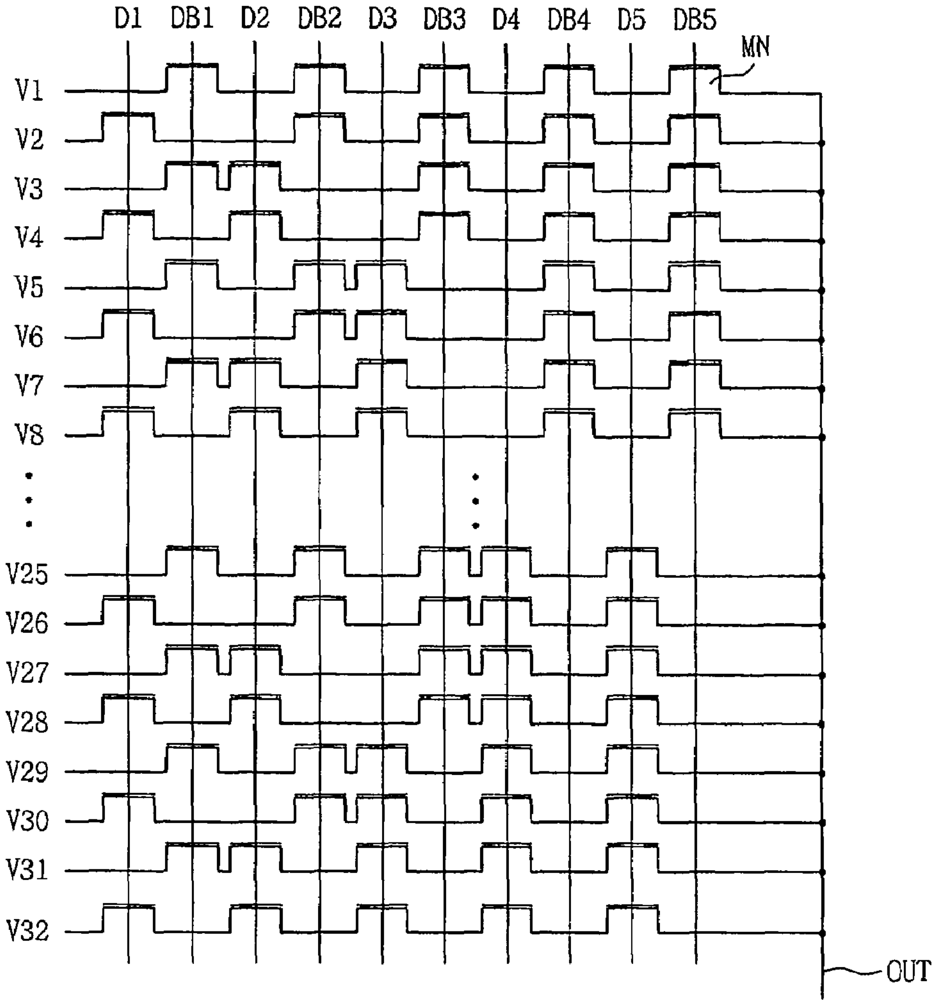

[Fig. 2]
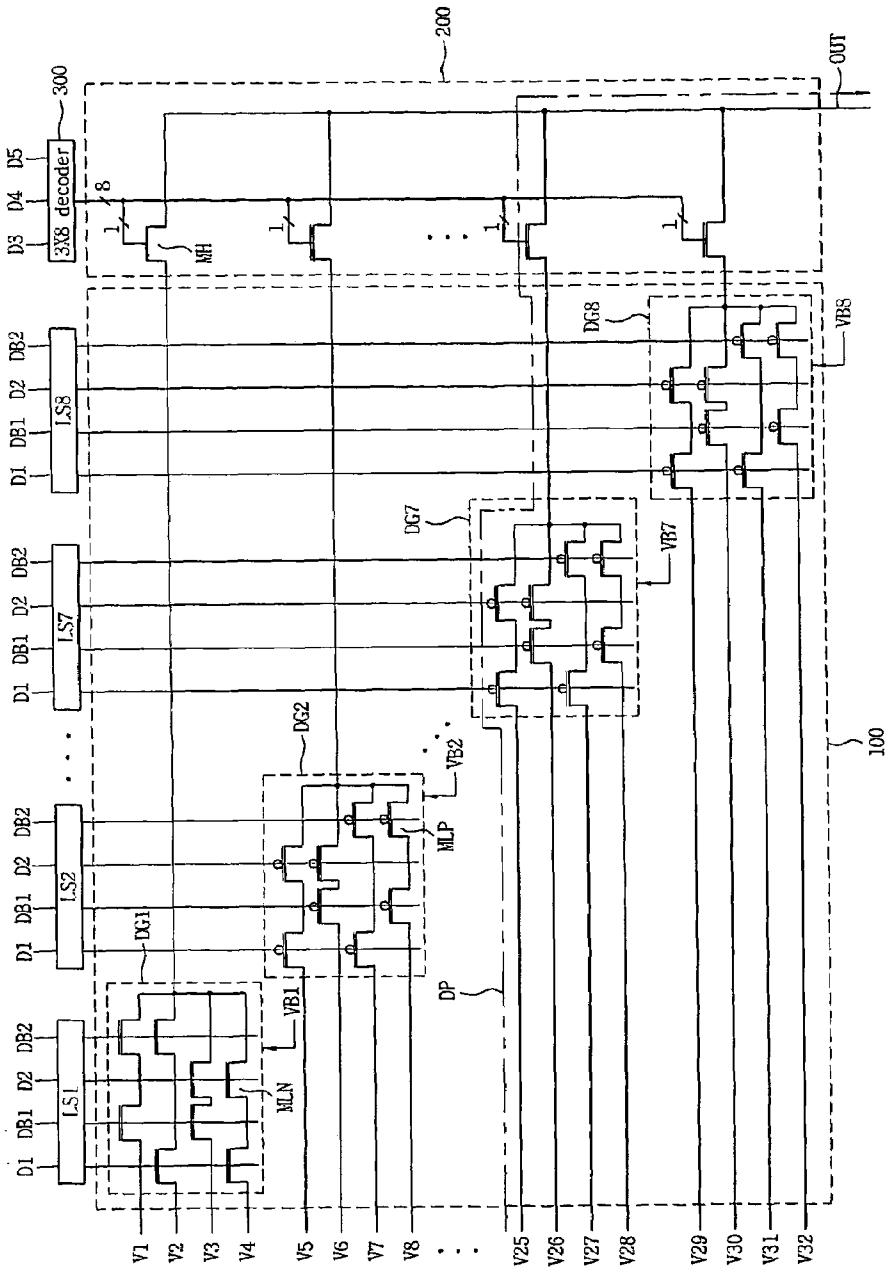

[Fig. 3]

| D5 | D4 | D3 | MH8 | MH7 | MH6 | MH5 | MH4 | MH3 | MH2 | MH1 |
|---|---|---|---|---|---|---|---|---|---|---|
| 0 | 0 | 0 | 0 | 0 | 0 | 0 | 0 | 0 | 0 | 1 |
| 0 | 0 | 1 | 0 | 0 | 0 | 0 | 0 | 0 | 1 | 0 |
| 0 | 1 | 0 | 0 | 0 | 0 | 0 | 0 | 1 | 0 | 0 |
| 0 | 1 | 1 | 0 | 0 | 0 | 0 | 1 | 0 | 0 | 0 |
| 1 | 0 | 0 | 0 | 0 | 0 | 1 | 0 | 0 | 0 | 0 |
| 1 | 0 | 1 | 0 | 0 | 1 | 0 | 0 | 0 | 0 | 0 |
| 1 | 1 | 0 | 0 | 1 | 0 | 0 | 0 | 0 | 0 | 0 |
| 1 | 1 | 1 | 1 | 0 | 0 | 0 | 0 | 0 | 0 | 0 |

[Fig. 4]
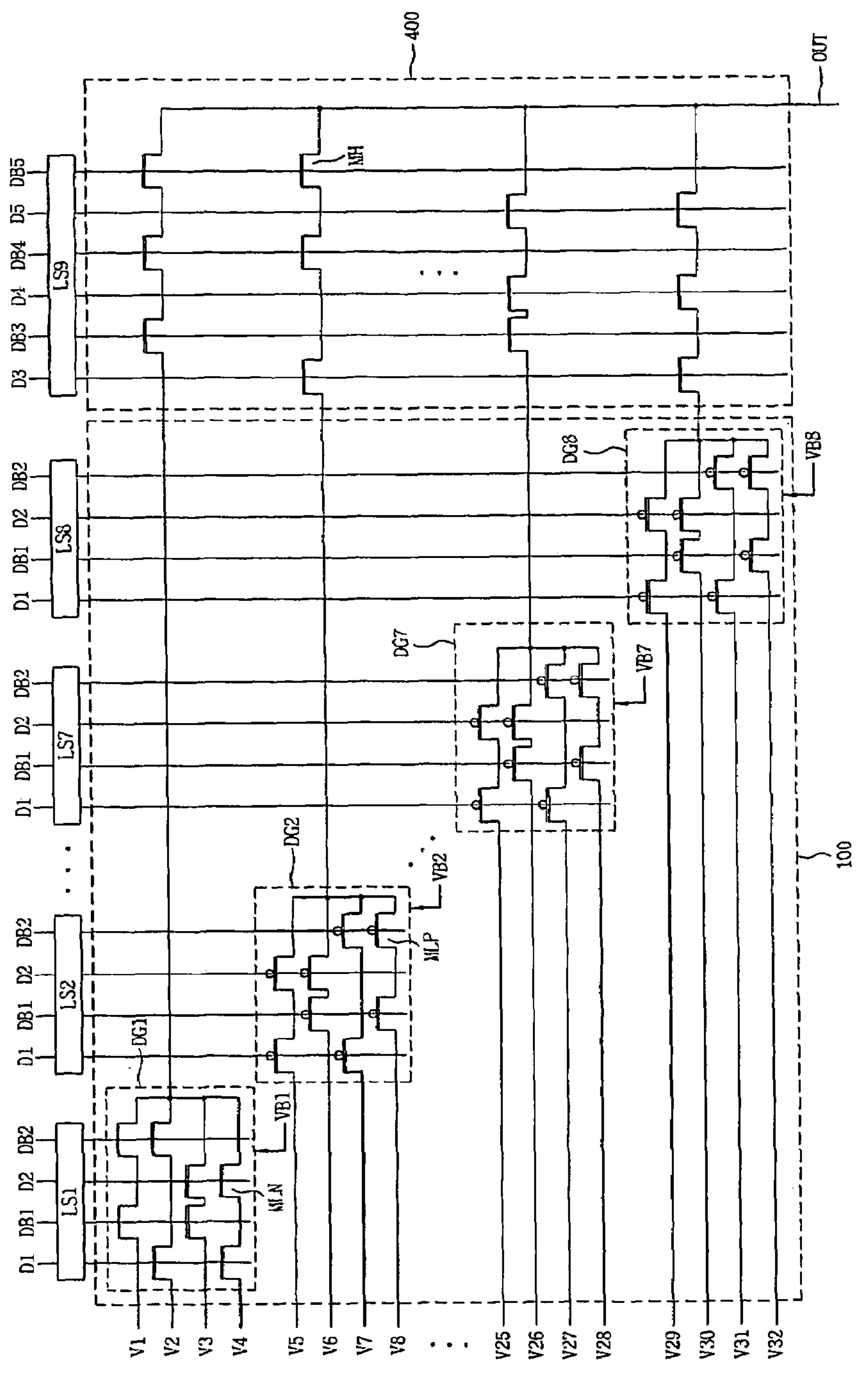

[Fig. 5]
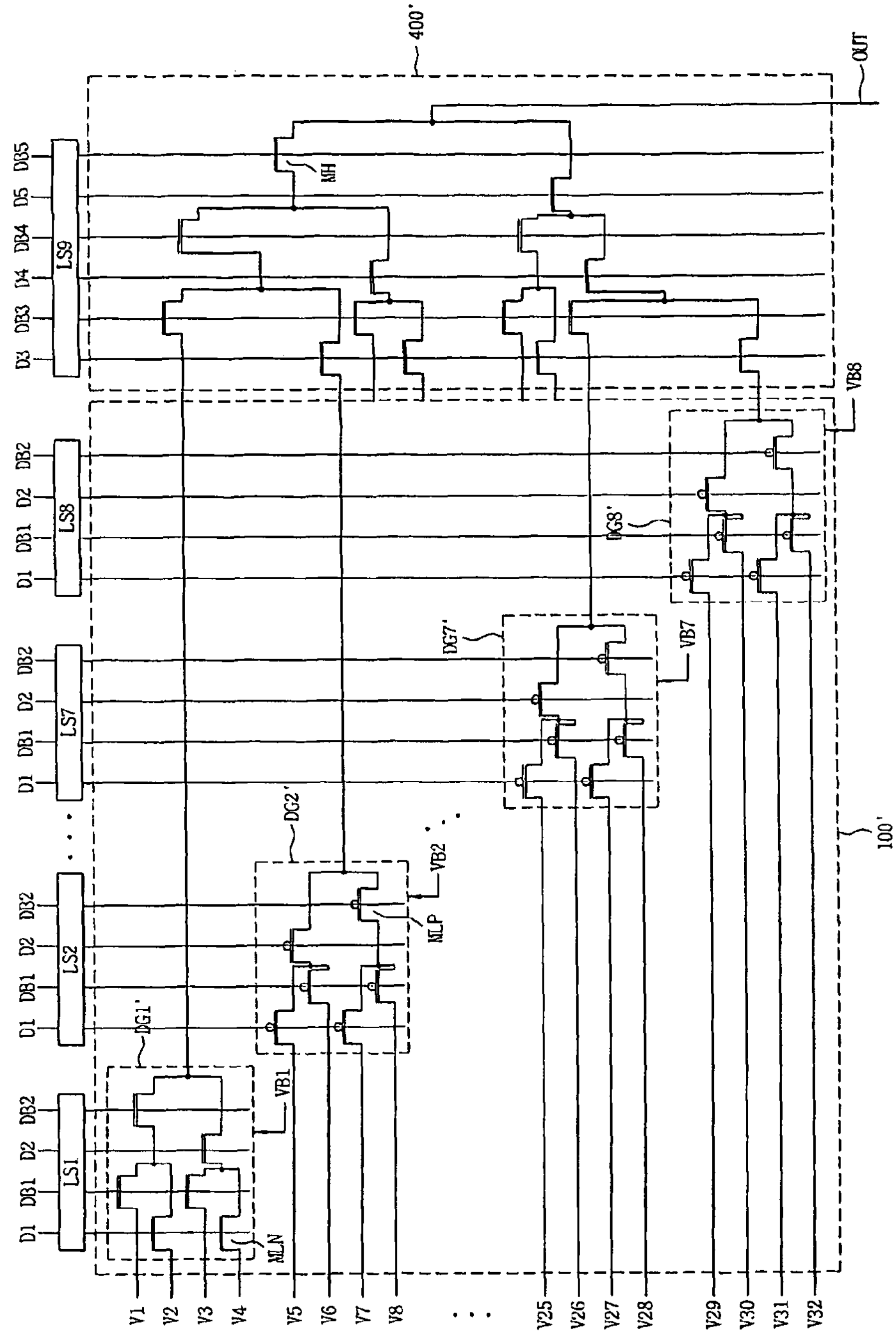

[Fig. 6]
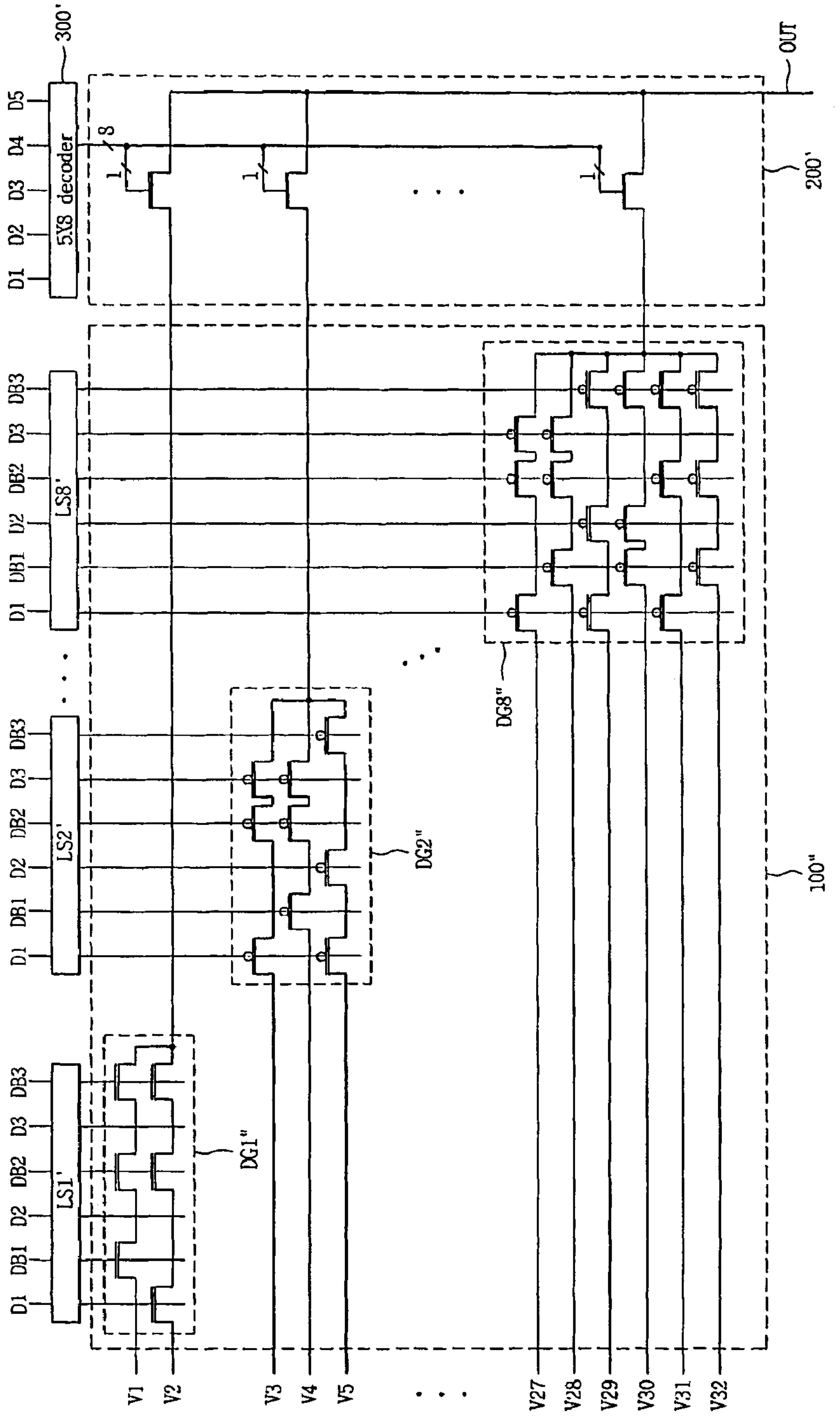

[Fig. 7]

| D5 | D4 | D3 | D2 | D1 | M8 | M7 | M6 | M5 | M4 | M3 | M2 | M1 |
|---|---|---|---|---|---|---|---|---|---|---|---|---|
| 0<br><br>0 | 0<br><br>0 | 0<br>~<br>0 | 0<br><br>0 | 0<br><br>1 | 0 | 0 | 0 | 0 | 0 | 0 | 0 | 1 |
| 0<br><br>0 | 0<br><br>0 | 0<br>~<br>1 | 1<br><br>0 | 0<br><br>0 | 0 | 0 | 0 | 0 | 0 | 0 | 1 | 0 |
| | | ⋮ | | | | | | ⋮ | | | | |
| 1<br><br>1 | 1<br><br>1 | 0<br>~<br>1 | 1<br><br>1 | 0<br><br>1 | 1 | 0 | 0 | 0 | 0 | 0 | 0 | 0 |

DECODING CIRCUIT FOR FLAT PANEL DISPLAY

The present application claims priority to Korean Patent Application No. 10-2005-0111093 (filed on Nov. 21, 2005) and PCT Patent Application PCT/KR2006/000485 (filed Feb. 10, 2006), both of which is hereby incorporated by reference in their entireties.

BACKGROUND ART

1. Field of the Invention

The present invention relates to a decoding circuit for a flat panel display, and more particularly to a decoding circuit for a flat panel display wherein a miniaturization is possible by reducing an area of the circuit.

2. Description of Related Art

Recently, a market for electrical appliances and personal computers is steadily increasing as well as a prevalence of portable electronic device such as a notebook computer and a personal communication device. A display device which is a final connection medium between these devices and a user requires a light weight and a low power consumption. Therefore, FPDs (Flat Panel Display) such as an LCD (Liquid Crystal Display), a PDP (Plasma Display Panel) and an OELD (Organic Electro Luminescent Display) instead of a CRT (Cathode Ray Tube) are generally used.

The FPD comprises a panel for actually displaying an image, a row column driving circuit and a column driving circuit. The column driving circuit is alternately referred to as a source driving circuit or a data driving circuit. The column driving circuit converts an image data of a digital format to an image data of an analog format, that is, to a gradation voltage which determines a brightness of a pixel. For instance, in case of a FPD having thirty two gradation voltages, one certain gradation voltage is selected using five bits of data. That is, the column driving circuit sequentially receives the five bits of the data and outputs a selected voltage having one of the thirty two voltage levels. In order to carry out this function, the column driving circuit comprises a decoding circuit for receiving the five bits of the data and outputting the selected voltage having one of the thirty two voltage levels.

FIG. 1 is a diagram illustrating a conventional decoding circuit.

Referring to FIG. 1, the decoding circuit outputs a voltage of thirty two gradation voltages V1 through V32 being outputted from a gradation voltage generator (not shown) corresponding to image data D1 through D5 through an output terminal. Each of gradation voltage terminals having thirty two voltages V1 through V32 inputted therethrough is connected to the output terminal OUT through five n-channel metal-oxide semiconductor field effect transistors (MOSFETs) MN connected in series. One of input data D1 through D5 and inverted input data DB1 through DB5 is applied to a gate of the five MOSFETs MN. Since the inverted input data DB1 through DB5 are applied to the gates of the MOSFETs connected to the gradation voltage terminal where the voltage V1 is applied, the voltage V1 is transmitted to the output terminal only when a data corresponding to "00000" is inputted. In addition, since the input data D1 and the inverted input data DB2 through DB5 are applied to the gates of the MOSFETs connected to the gradation voltage terminal where the voltage V2 is applied, the voltage V2 is transmitted to the output terminal only when a data corresponding to "00001" is inputted. Similarly, since the input data D1 through D5 are applied to the gates of the MOSFETs connected to the gradation voltage terminal where the voltage V32 is applied, the voltage V32 is transmitted to the output terminal only when a data corresponding to "11111" is inputted. The decoding circuit shown in FIG. 1 operates as described above to transmit one of thirty two voltages to the output terminal OUT.

However, the conventional decoding circuit is disadvantageous that the circuit occupies a large area. The reason the decoding circuit occupies the large area is that not only a large number of MOSFETs (32*5=160 in the above example) are used but also an area of each MOSFET is large. The area of each MOSFET tends to increase as a change in a voltage used increases. For instance, if V1 is 0V and V32 is 16V in the above example, the MOSFET should be designed according to a design rule of 2 m. the MOSFET designed according to the design rule has an area a few to tens of times larger than a MOSFET designed according to a design rule of 0.35 m used in a digital circuit having a swing range of 3V. Therefore, the area of the decoding circuit is largely increased.

SUMMARY OF THE INVENTION

It is an object of the present invention to provide a decoding circuit for a flat panel display wherein the area of MOSFET used in the decoding circuit is reduced so as to allow miniaturization compared to the convention art.

In accordance with a first aspect of the present invention, there is provided a decoding circuit comprising: a first decoder for selecting a predetermined number of gradation voltages from a plurality of gradation voltages according to a least significant bit or least significant bits of an image data; a second decoder for selecting one of the selected gradation voltages to be outputted to an output terminal according to a plurality of selection signals; and a third decoder for outputting the plurality of the selection signals according to a most significant bit or most significant bits of the image data, wherein a minimum length of gates of a plurality of MOSFETs included in the first decoder is shorter than that of a plurality of MOSFETs included in the second decoder.

In accordance with a second aspect of the present invention, there is provided a decoding circuit comprising: a first decoder for selecting a predetermined number of gradation voltages from a plurality of gradation voltages according to a least significant bit or least significant bits of an image data; and a second decoder for selecting one of the selected gradation voltage to be outputted to an output terminal according to a most significant bit or most significant bits of the image data, wherein a minimum length of gates of a plurality of MOSFETs included in the first decoder is shorter than that of a plurality of MOSFETs included in the second decoder.

In accordance with a third aspect of the present invention, there is provided a decoding circuit including a plurality of decoding paths selectively providing one of a plurality of gradation voltages to an output terminal according to a plurality of image data, wherein one of the plurality of the decoding paths comprises: a plurality of low voltage MOSFETs connected in series having the one of the plurality of the gradation voltages applied to a first terminal thereof; and at least one high voltage MOSFETs connected in series between a second terminal of the plurality of the low voltage MOSFETs and the output terminal.

BRIEF DESCRIPTION OF THE DRAWINGS

FIG. 1 is a diagram illustrating a conventional decoding circuit.

FIG. 2 is a diagram illustrating a decoding circuit in accordance with a first preferred embodiment of the present invention.

FIG. 3 is a diagram illustrating a relation between a third data D3 through a fifth data D5 and selection signals MH1 through MS8 of eight bits being inputted to a third decoder 300 of FIG. 2.

FIG. 4 is a diagram illustrating a decoding circuit in accordance with a second preferred embodiment of the present invention.

FIG. 5 is a diagram illustrating a decoding circuit in accordance with a third preferred embodiment of the present invention.

FIG. 6 is a diagram illustrating a decoding circuit in accordance with a fourth preferred embodiment of the present invention.

FIG. 7 is a diagram illustrating a relation between a first data D1 through a fifth data D5 and selection signals MH1 through MS8 of eight bits being inputted to a third decoder 300' of FIG. 2.

DETAILED DESCRIPTION OF THE INVENTION

The present invention will now be described in detail with reference to the accompanied drawings. The interpretations of the terms and wordings used in Description and Claims should not be limited to common or literal meanings. The embodiments are provided for the skilled in the art to more completely understand the present invention.

First Embodiment

FIG. 2 is a diagram illustrating a decoding circuit in accordance with a first preferred embodiment of the present invention. In accordance with the decoding circuit of FIG. 2, one of a plurality of gradation voltages V1 through V32 are outputted to an output terminal OUT according to image data D1 through D5 of five bits. Referring to FIG. 2, the decoding circuit comprises a first decoder 100, a second decoder 200 and a third decoder 300. In addition, the decoding circuit may further comprise a plurality of level shifters LS1 through LS8.

The first decoder 100 selects and outputs a predetermined number of gradation voltages from a plurality of gradation voltages according to a least significant bit or least significant bits of an image data. In accordance with the embodiment, the first decoder 100 selects and outputs eight gradation voltages of thirty two gradation voltages according to three least significant bits D1, D2 and D3. MOSFETs MLN and MLP included in the first decoder are low voltage MOSFETs contrary to high voltage MOSFET MH included in the second decoder 200. Different design rules are applied to the high voltage MOSFET and the low voltage MOSFET, and generally, a design rule having a relatively larger value is applied to the high voltage MOSFET compared to that of the low voltage MOSFET. The difference between the design rules of the high voltage MOSFET and the low voltage MOSFET is manifest in a minimum gate length. The minimum gate length of the high voltage MOSFET is larger than that of the low voltage MOSFET in order to prevent a punch-through effect, a near punch-through effect and other related effects. Since the MOSFETs MLN and MLP included in the first decoder 100 has a short gate length, the area of the decoding circuit in accordance with the embodiment of the present invention including the first decoder 100 is smaller than that of the convention decoding circuit. However, the decoding circuit in accordance with the embodiment of the present invention may additionally comprise a power supply line (not shown) for applying a body voltage and the level shifters LS1 through LS8, and the area of the decoding circuit may be increased accordingly. In order to prevent this, it is preferable that the gate length of the MOSFETs MLN and MLP used in the first decoder 100 is no more than one half of the gate length of the MOSFETs MH.

In order to prevent the related effects despite the use of the low voltage MOSFET in the first decoder 100, body voltages VB1 through VB8 of the MOSFETs MLN and MLP should have levels corresponding to the gradation voltages applied to a source and a drain of the MOSFETs MLN and MLP. The body voltage refers to a voltage applied to a well when the MOSFET has the well, and to a voltage applied to a substrate when MOSFET does not have the well. In addition, "body voltages VB1 through VB8 of the MOSFETs MLN and MLP should have levels corresponding to the gradation voltages applied to a source and a drain of the MOSFETs MLN and MLP" refers to "body voltages VB1 through VB8 of the MOSFETs MLN and MLP have levels close to the gradation voltages applied to the source and the drain of the MOSFETs MLN and MLP within a range that imposes no problem on the related effects". For instance, if the near punch-through effect produces a large problem when a voltage difference between the body and source and drain is larger than 3V, the body voltage should be determined within a range wherein the difference between the body voltage and the gradation voltage applied to the source and the drain is less than 3V. In addition, when a swing range of a gate voltage of the MOSFETs MLN and MLP imposes a problem due to the related effects, the gate voltage of the MOSFETs MLN and MLP should have a swing range corresponding to the gradation voltage applied to the source and the drain of the MOSFETs MLN and MLP and the body voltage.

The first decoder 100 includes a plurality of decoding groups DG1 through DG8 consisting of a plurality of the MOSFETs MLN and MLP. The same body voltage is applied to the plurality of the MOSFETs constituting each decoding group, and different body voltages are applied to different decoding groups. The reason for dividing the first decoder 100 into decoding groups is that an area of a circuit used for generating and transmitting the body voltage is reduced by reducing types of the body voltages VB1 through VB8 applied to the first decoder 100. The body voltage applied to a decoding group of the different decoding groups to which a high gradation voltage applied thereto is higher than a body voltage applied to a decoding group to which a low gradation voltage applied. Generally, since a minimum voltage of voltages applied to the source and the drain of the MOSFET is used as the body voltage in case of the n-channel MOSFET, it is preferable that the body voltage of the first decoding group DG1 using the n-channel MOSFET is the same as the first gradation voltage V1 which is the lowest voltage of the gradation voltages V1 through V4 being inputted to the first decoding group DG1. In addition, generally, since a maximum voltage of voltages applied to the source and the drain of the MOSFET is used as the body voltage in case of the p-channel MOSFET, it is preferable that the body voltage of the second decoding group DG2 using the p-channel MOSFET is the same as the eighth gradation voltage V8 which is the highest voltage of the gradation voltages V5 through V8 being inputted to the second decoding group DG2. When the lowest or the highest gradation voltage of the gradation voltages inputted to the decoding groups is used as the body voltage, it is advantageous that the body voltage need not to be separately generated. For example, when the gradation voltages V1 through V4 applied to the first decoding group DG1 is 0, 0.5, 1 and 1.5V respectively, and when the first decoding group DG1 is the n-channel MOSFET, the body voltage VB1 applied to the first decoding group DG1 may be 0V which is identical to the first gradation voltage V1. In addition, when the gradation voltages V5 through V8 applied to the second decoding group DG2 is 2, 2.5, 3 and 3.5V respectively, and when the second decoding group DG2 is the p-channel MOSFET, the body voltage VB2 applied to the second decoding group DG2 may be 3.5V which is identical to the eighth gradation voltage V8. Moreover, when the gradation voltages V29 through V32 applied to the eighth decoding group DG8 is 14, 14.5, 15 and 15.5V respectively, and when the eighth decoding group DG8 is the 9-channel MOSFET, the body voltage VB8 applied to the eighth decoding group DG8 may be 15.5V which is identical to the thirty second gradation voltage V32. A plurality of gate voltages of an identical high level and an identical low level is applied to the plurality of the MOSFETs constituting a decoding group of the plurality of the decoding groups DG1 through DG8 included in the first decoder 100. In addition, high levels and low level of the gate voltages applied to different decoding groups are different from each other. Specifically, four gate voltages being outputted from the first level shifter LS1 are applied to the first decoding group DG 1. the four gate voltages has a logic value corresponding to the first data D1, the second data D2 and the inverted data DB1 and DB2 thereof, respectively. In addition, the high level and the low level of the four gate voltages are identical. On the contrary, the high level and the low level of the gate voltages applied to the first decoding group DG1 differ from those of the second decoding group DG2. Of the plurality of the decoding groups DG1 through DG8 included in the first decoder 100, the high level of the gate voltage of the decoding group to which a high gradation voltage is inputted is higher than that of the decoding group to which a low gradation voltage is inputted, and of the plurality of the decoding groups, the low level of the gate voltage of the decoding group to which the high gradation voltage is inputted is higher than that of the decoding group to which a low gradation voltage is inputted. For instance, when the gradation voltages V1 through V4 applied to the first decoding group DG1 are between 0 and 1.5V, and when the first decoding group DG1 is n-channel MOSFET, the high level and the low level of the gate voltage applied to the first decoding group DG1 may be 2.5V and 0V, respectively. The n-channel MOSFET MLN is turned on when the gate voltage of the high level is applied, and the n-channel MOSFET MLN is turned off when the gate voltage of the low level is applied. In addition, when the gradation voltages V5 through V8 applied to the second decoding group DG2 are between 2 and 3.5V, and when the second decoding group DG2 is p-channel MOSFET, the high level and the low level of the gate voltage applied to the second decoding group DG2 may be 3.5V and 1V, respectively. The p-channel MOSFET MLP is turned off when the gate voltage of the high level is applied, and the p-channel MOSFET MLP is turned on when the gate voltage of the low level is applied. Similarly, when the gradation voltages V29 through V32 applied to the eighth decoding group DG8 are between 14 and 15.5V, and when the eighth decoding group DG8 is p-channel MOSFET, the high level and the low level of the gate voltage applied to the eighth decoding group DG8 is 15.5V and 13V, respectively. While the first decoding group DG1 consists of the n-channel MOSFETs and rest of the decoding groups DG2 through DG8 are consisting of the p-channel MOSFETs in FIG. 2, the entire decoding groups DG1 through DG8 may consist of the n-channel MOSFETs or the entire decoding groups DG1 through DG8 may consist of the p-channel MOSFETs. However, since generally only the p-channel MOSFET uses a well and the n-channel MOSFET does not, and separate body voltages cannot be applied to the plurality of the n-channel MOSFETs, the p-channel should be used to apply various body voltages. In addition, when the entire decoding groups consist of the p-channel MOSFETs, the gate voltage of the low level of the first decoding group DG1 should be lower than the first gradation voltage (0V in this embodiment), for example −1V, in order to turn on the p-channel MOSFET. Therefore, the gate voltage used in the first decoder 100 in this case ranges from −1 to 15.5V, and it is disadvantageous that the range of the gate voltage is large compared to the embodiment shown in FIG. 2 wherein the gate voltage used in the first decoder 100 ranges from 0 to 15.5V when the entire decoding groups are p-channel MOSFETs.

The second decoder 200 selects and outputs one of the gradation voltages being outputted from the first decoder 100. As shown, the second decoder 200 selects one of eight gradation voltages being output from the first decoder 100 according to a selection signal of eight bits transmitted from the third decoder 300. Each of the plurality of the MOSFETs MH included in the second decoder 200 is connected between the first decoder 100 and the output terminal OUT. Since the plurality of the MOSFETs MH included in the second decoder 200 are connected to the output terminal OUT, one of the first gradation voltage V1 through the thirty second gradation voltage V32 may be applied. Therefore, in order to operate normally against a wide range of voltages, the plurality of the MOSFETs MH included in the second decoder 200 should be high voltage MOSFETs. Moreover, the plurality of the MOSFETs MH included in the second decoder 200 may be n-channel MOSFETs as shown or may be p-channel MOSFETs.

The third decoder 300 outputs a plurality of selection signals according to a most significant bit or most significant bits of the image data D1 through D5. As shown, the third decoder 300 outputs the selection signal of eight bits according to the third data D3 to the fifth data D5 of the image data D11 through D5. A relationship between the third data D3 to the fifth data D5 of eight bits and the selection signal MH1 through MH8 are shown in FIG. 3. Referring to FIG. 3, 'MH1' refers to the selection signal applied to a gate of the MOSFET MH connected to the first decoding group, and 'MH8' refers to the selection signal applied to a gate of the MOSFET MH connected to the eighth decoding group. "0" refers to applying the selection signal so that the MOSFET is turned off, and "1" refers to applying the selection signal so that the MOSFET is turned on.

The plurality of the level shifter LS1 through LS8 applies the gate voltages having different high levels and low levels to the plurality of the decoding groups.

A path which connects a terminal to which each gradation voltage is applied to the output terminal OUT in the decoding circuit is referred to as a decoding path DP. In accordance with the embodiment, since a total of thirty two gradation voltages are inputted and there is one output terminal OUT, there are thirty two decoding paths. Only one decoding path which delivers the twenty fifth gradation voltage V25 to the output terminal OUT is shown in FIG. 3 for a convenience of description. Of the plurality of the MOSFETs included in each of the decoding paths DP, the plurality of the MOSFETs serially connected to the terminal to which the gradation voltage is applied is low voltage MOSFETs, and the MOSFETs connected to the output terminal OUT are high voltage MOSFETs.

Second Embodiment

FIG. 4 is a diagram illustrating a decoding circuit in accordance with a second preferred embodiment of the present invention. Referring to FIG. 4, the decoding circuit comprises a first decoder 100 and a second decoder 400. In addition, the decoding circuit may further comprise a plurality of level shifters LS1 through LS9.

The first decoder 100 is similar to the first decoder 100 of the first embodiment. Therefore, a detailed description is omitted.

The second decoder 400 selects one of the gradation voltages being outputted from the first decoder 100 according to a most significant bit or most significant bits of the image data D1 through D5 and outputs the selected gradation voltage to the output terminal OUT. In accordance with the second embodiment, the second decoder 400 selects one of the eight gradation voltages being output from the first decoder 100 according to the most significant three bits D3, D4 and D5 and outputs the selected gradation voltage to the output terminal OUT. As shown, the second decoder 400 includes a total of twenty four MOSFETs MH, and the MOSFETs are divided into eight groups, each of the eight groups comprising three MOSFETs connected in series, and each of the eight groups is connected to the first decoder 100 and the output terminal OUT. The plurality of the MOSFETs MH included in the second decoder 400 should be high voltage MOSFETs. In addition, the plurality of the MOSFETs MI included in the second decoder may be n-channel MOSFETs as shown, or may be p-channel MOSFETs.

The first level shifter LS1 through eighth level shifter LS8 applies gate voltages having different high levels and low level to the plurality of the decoding groups. The ninth level shifter LS9 applies a gate voltage to the second decoder 400 according to the third data D3 through the fifth data D5 and the inverted data DB3 through DB5 thereof.

Third Embodiment

FIG. 5 is a diagram illustrating a decoding circuit in accordance with a third preferred embodiment of the present invention. In accordance with the decoding circuit of the third embodiment, a first decoder 100' and a second decoder 400' differ from the decoding circuit in accordance with the second embodiment shown in FIG. 4, and other components are identical to those of the second embodiment. Contrary to FIG. 4, each of MOSFETs included a plurality of decoding groups DG1' through DG8' included in the first decoder 100' has a tree type arrangement. When the plurality of the MOSFETs have the tree type arrangement, the number of MOSFETs included in each of the decoding groups is reduced, thereby reducing the number of MOSFETs used. While eight MOSFETs are used for each of the decoding groups DG1 through DG8 of FIG. 4, six MOSFETs are used for each of the decoding groups DG1' through DG8' of FIG. 5. In addition, the plurality of the MOSFETs included in the second decoder 400' has the tree type arrangement. While twenty four MOSFETs are used for the second decoder 400 of FIG. 4, only fourteen MOSFETs are used for the second decoder 400' of FIG. 5, thereby reducing the number of decoder used in the decoding circuit of FIG. 5.

Fourth Embodiment

FIG. 6 is a diagram illustrating a decoding circuit in accordance with a fourth preferred embodiment of the present invention. Referring to FIG. 6, the decoding circuit comprises a first decoder 100", a second decoder 200' and a third decoder 300'. In addition, the decoding circuit may further comprise a plurality of level shifters LS1' through LS8'.

The decoding circuit of FIG. 6 is used in case the image data and the gradation voltage are non-linear due to a gamma compensation or a non-linear relation between the gradation voltage and the brightness. When V1=0V, V2=1.5V, V3=2.5V, V4=3.2V, V5=3.9V, . . . , V27=14.2V, V28=14.5V, V29=14.8V, V30=15.1V, V31=15.4V, V32=15.7V, and when the voltages are divided into decoding groups for every two volts, decoding groups DG1" through DG8" as shown in FIG. 6 are formed. A relation between the first data D1 through the fifth data D5 being inputted to the third decoder 300' and the selection signals MH1 through MH8 of eight bits are shown in FIG. 7.

In accordance with the description, the gate voltages having identical on-level and off-level are applied to the decoding group to which identical body voltages are applied. However, the gate voltages having different on-levels and off-levels may be applied to the decoding group to which identical body voltages are applied. In addition, a plurality of the body voltages may be applied in the decoding group to which the gate voltages having identical on-level and off-level are applied. That is, a boundary of a decoding group to which the identical body voltage is applied may not coincide with that of a decoding group to which the gate voltages having identical on-levels and off-levels are applied.

While description of the present invention is mainly focused on the decoding circuit of five bits, the present invention may not only be applied to the decoding circuits of five bits but also to various decoding circuits including decoding circuits of six bits, eight bits and ten bits.

The MOSFETs disclosed in description and claims of the present invention refers to MOSFETs of a broad meaning. Therefore, the gate electrode may not consist of metal, and may be a conductive material. For example, the gate electrode may be a polysilicon. In addition, an oxide film is not required to be disposed between the gate electrode and the semiconductor substrate, and an insulating material is sufficient.

As described above, the decoding circuit is advantageous in that the area of the MOSFET is reduced to facilitate a miniaturization.

The invention claimed is:

1. A decoding circuit comprising:

a first decoder configured to select a predetermined number of gradation voltages from a plurality of gradation voltages, wherein the first decoder is configured to select the predetermined number of gradation voltages according to a least significant bit or least significant bits of image data;

a second decoder configured to select an output gradation voltage from said gradation voltages selected by the first decoder, wherein the second decoder is configured to output the output gradation voltage to an output terminal, wherein selection and output of the output gradation voltage is in accordance with a plurality of selection signals; and a third decoder configured to output the plurality of the selection signals according to a most significant bit or most significant bits of the image data, wherein a minimum length of gates of a plurality of MOSFETs comprised in the first decoder is shorter than a minimum length of gates of a plurality of MOSFETs comprised in the second decoder, wherein the first decoder comprises a plurality of decoding groups; and each of the plurality of the decoding groups comprising a plurality of MOSFETs having a plurality of gate voltages of an identical high level and an identical low level applied thereto, and different decoding groups of the plurality of the decoding groups having gate voltages of different high levels and low levels applied thereto, wherein the circuit further comprises a plurality of level shifters configured to apply gate voltages having different high levels and low levels to the different decoding groups.

2. The circuit in accordance with claim 1, wherein a source and a drain of each of the plurality of the MOSFETs comprised in the second decoder is connected to the first decoder and the output terminal respectively.

3. The circuit in accordance with claim 1, wherein a plurality of body voltages are applied to the plurality of the MOSFETs comprised in the first decoder, the body voltage of each of the MOSFETs comprised in the first decoder has a level corresponding to the gradation voltages applied to a source and a drain of the MOSFETs.

4. The circuit in accordance with claim 3, wherein a plurality of gate voltages having a plurality of swing ranges are applied to the plurality of the MOSFETs comprised in the first decoder, the swing range of the gate voltage of each of the MOSFETs comprised in the first decoder corresponds to the body voltage and the gradation voltage applied to the source and the drain of the MOSFETs.

5. The circuit in accordance with claim 1, wherein the first decoder comprises a plurality of decoding groups, wherein each of the plurality of the decoding groups comprises a plurality of MOSFETs having identical body voltages applied thereto, and wherein different decoding groups of the plurality of the decoding groups have different body voltages applied thereto.

6. The circuit in accordance with claim 5, wherein, of the different decoding groups, body voltages applied to a decoding group having a high gradation voltage applied thereto is higher than a body voltage applied to a decoding group having a low gradation voltage applied thereto.

7. The circuit in accordance with claim 5, wherein:

one of the plurality of the decoding groups comprises a plurality of n-channel MOSFETs; and a level of the body voltage of said one of the plurality of the decoding groups is identical to a minimum voltage level of the gradation voltage applied to said one of the plurality of the decoding groups.

8. The circuit in accordance with claim 5, wherein one of the plurality of the decoding groups comprises a plurality of p-channel MOSFETs, and a level of the body voltage of the one of the plurality of the decoding groups is identical to a maximum voltage level of the gradation voltage applied to the one of the plurality of the decoding groups.

9. The circuit in accordance with claim 5, wherein a plurality of MOSFETs of one of the plurality of the decoding groups has a tree type arrangement.

10. The circuit in accordance with claim 5, wherein a level of the gradation voltages applied to one of the plurality of the decoding groups is different from that of a rest of the plurality of the decoding groups.

11. The circuit in accordance with claim 1, wherein:

in the different decoding groups, a gate voltage having a high level in a decoding group having a high gradation voltage applied thereto is higher than a gate voltage having a high level in a decoding group having a low gradation voltage applied thereto; and in the different decoding groups, a gate voltage having a low level in the decoding group having the high gradation voltage applied thereto is higher than a gate voltage having a low level in the decoding group having the low gradation voltage applied thereto.

12. The circuit in accordance with claim 1, wherein:

n-channel MOSFETs are used in a decoding group having the plurality of the decoding groups having a low gradation voltage applied thereto; and p-channel MOSFETs are used in decoding group having the plurality of the decoding groups not having a low gradation voltage applied thereto.

13. The circuit in accordance with claim 1, wherein a minimum gate length of the plurality of the MOSFETs of the first decoder is equal to or less than one half of a minimum gate length of the plurality of the MOSFETs of the second decoder.

14. A decoding circuit comprising:

a first decoder configured to select a predetermined number of gradation voltages from a plurality of gradation voltages according to a least significant bit or least significant bits of image data; and a second decoder configured to select an output gradation voltage from said gradation voltages selected by the first decoder, wherein the second decoder is configured to output the output gradation voltage to an output terminal, wherein selection and output of the output gradation voltage is in accordance with a most significant bit or most significant bits of the image data, wherein a minimum length of gates of a plurality of MOSFETs comprised in the first decoder is shorter than a minimum length of gates of a plurality of MOSFETs comprised in the second decoder, wherein the first decoder comprises a plurality of decoding groups; each of the plurality of decoding groups comprising a plurality of MOSFETs having a plurality of gate voltages having an identical high level and an identical low level applied thereto; and different decoding groups of said plurality of decoding groups have gate voltages of different high levels and low levels applied thereto, and wherein the circuit further comprises a plurality of level shifters configured to apply gate voltages having different high levels and low levels to the different decoding groups.

15. The circuit in accordance with claim 14, wherein:

the plurality of the MOSFETs comprised in the second decoder are divided into a plurality of groups;

each of said plurality of groups comprises a plurality of MOSFETs connected in series; and each of said plurality of groups are connected to the first decoder and the output terminal respectively.

16. The circuit in accordance with claim 14, wherein the plurality of MOSFETs comprised in the second decoder have a tree type arrangement.

17. The circuit in accordance with claim 14, wherein:

a plurality of body voltages are applied to the plurality of the MOSFETs comprised in the first decoder; and the body voltage of each of the MOSFETs comprised in the first decoder has a level corresponding to the gradation voltages applied to a source and a drain thereof.

18. The circuit in accordance with claim 17, wherein:

a plurality of gate voltages having a plurality of swing ranges are applied to the plurality of the MOSFETs comprised in the first decoder; and the swing range of the gate voltage of each of the MOSFETs included in the first decoder corresponds to the body voltage and the gradation voltage applied to the source and the drain thereof.

19. The circuit in accordance with claim 14, wherein:

the first decoder comprises a plurality of decoding groups;

each of said plurality of decoding groups comprises a plurality of MOSFETs having an identical body voltage applied thereto; and different decoding groups of said plurality of decoding groups has different body voltages applied thereto.

20. The circuit in accordance with claim 19, wherein of the different decoding groups, a body voltage applied to a decoding group having a high gradation voltage applied thereto is higher than a body voltage applied to a decoding group having a low gradation voltage applied thereto.

21. The circuit in accordance with claim 19, wherein:

one of said plurality of decoding groups comprises a plurality of n-channel MOSFETs; and a level of the body voltage of said one of said plurality of the decoding groups is identical to a minimum voltage level of the gradation voltage applied to said one of said plurality of the decoding groups.

22. The circuit in accordance with claim 19, wherein:

one of said plurality of decoding groups comprises a plurality of p-channel MOSFETs; and a level of the body voltage of said one of said plurality of decoding groups is identical to a maximum voltage level of the gradation voltage applied to said one of said plurality of decoding groups.

23. The circuit in accordance with claim 19, wherein a plurality of MOSFETs of one of said plurality of decoding groups has a tree type arrangement.

24. The circuit in accordance with claim 19, wherein a level of the gradation voltages applied to one of said plurality of decoding groups is different from that of a rest of the plurality of decoding groups.

25. The circuit in accordance with claim 14, wherein:

of the different decoding groups, a gate voltage of a high level of a decoding group having a high gradation voltage applied thereto is higher than a gate voltage of a high level of a decoding group having a low gradation voltage applied thereto; and of the different decoding groups, a gate voltage of a low level of the decoding group having the high gradation voltage applied thereto is higher than a gate voltage of a low level of the decoding group having the low gradation voltage applied thereto.

26. The circuit in accordance with claim 14, wherein:

n-channel MOSFETs are used in a decoding group of the plurality of decoding groups having a low gradation voltage applied thereto; and p-channel MOSFETs are used in the rest of the plurality of the decoding groups.

27. The circuit in accordance with claim 14, wherein a minimum gate length of the plurality of MOSFETs of the first decoder is equal to or less than one half of a minimum gate length of the plurality of MOSFETs of the second decoder.

28. A decoding circuit comprising a plurality of decoding paths, wherein each of the plurality of decoding paths selectively provides one of a plurality of gradation voltages to an output terminal according to at least one image data, wherein one of the plurality of the decoding paths comprises:

a plurality of low voltage MOSFETs connected in series having one of said plurality of gradation voltages applied to a first terminal thereof; and at least one high voltage MOSFET connected in series between a second terminal of said plurality of low voltage MOSFETs and the output terminal, wherein a difference between a high level and a low level of a gate voltage of said plurality of low voltage MOSFETs is smaller than a difference between a high level and a low level of a gate voltage of said at least one high voltage MOSFET.

29. The circuit in accordance with claim 28, wherein a body voltage of said plurality of low voltage MOSFETs is different from said at least one high voltage MOSFET.

30. The circuit in accordance with claim 28, wherein each of said plurality of low voltage MOSFETs include a well.

31. The circuit in accordance with claim 28, wherein:

the low voltage MOSFETs is distinguished from the high voltage MOSFETs by a minimum gate length thereof; and the minimum gate length of the low voltage MOSFETs is shorter than that of the high voltage MOSFETs.

32. The circuit in accordance with claim 31, wherein the minimum gate length of the low voltage MOSFETs is equal to or less than one half of that of the high voltage MOSFETs.

* * * * *